SEMICONDUCTOR METHOD AND DEVICE

Original Filed April 13, 1964

INVENTORS
James J. Casey
Richard R. Garnache
BY Connolly and Hutz
ATTORNEYS 3,337,375

SEMICONDUCTOR METHOD AND DEVICE

James J. Casey, Williamstown, and Richard R. Garnache, Clarksburg, Mass., assignors to Sprague Electric Company, North Adams, Mass., a corporation of Massachusetts Original application Apr. 13, 1964, Ser. No. 359,051. Divided and this application June 24, 1964, Ser. No. 384,568
1 Claim. (Cl. 148—33)

ABSTRACT OF THE DISCLOSURE

A metallic layer is sandwiched between semiconductor layers of the same crystal orientation as a semiconductor substrate on which all three layers are deposited. Keeping the metallic layer thinner than the mean free path of the charge carriers therethrough permits attainment of the top semiconductive layer with the same crystalline orientation as the other two semiconductive members.

This is a division of application Ser. No. 359,051, filed Apr. 13, 1964.

This invention relates to a method for making semiconductor devices and the devices made thereby, and more particularly to a method for growing alternate layers of monocrystalline semiconductor material and metallic material and to the resulting device.

Typical prior art methods for making semiconductor devices consist in the formation of junctions in a piece of monocrystalline semiconductor material by a process of diffusion, epitaxial growth, or alloying. By another method a junction is formed by the electrochemical plating of metal to the surface of monocrystalline semiconductor material. Another method which has been used recently concentrates on sandwiching a metallic layer between two monocrystalline layers of semiconductor material. Structures obtained from this method allow optimum high frequency response with respect to other devices and are therefore of particular interest. The theoretical expectations from these last structures cannot be matched by techniques which are known to the art at the present time. In one of these techniques a metallic layer is evaporated on monocrystalline semiconductor material and a second crystal consisting of the same as the starting material is put into pressure contact with the metallic layer. The last technique is commonly used for making such high frequency devices. It would be desirable to form a monocrystalline layer of semiconductor material on top of the metallic layer so that there is an intimate contact between both. Such a contact would afford a high injection efficiency of current carriers into the metallic layer. There are, however, two considerations which make it appear doubtful that a monocrystalline semiconductor layer on top of the metallic layer can be obtained. The first objection originates from the fact that normally there have to be matches between the lattice constants of the metallic and the semiconductor layers. Another objection is found in those cases where the crystallographic systems of the semiconductor layer and the metallic layer are different. Surprisingly enough it could be demonstrated that it is possible to grow monocrystalline semiconductor material on top of a metallic layer which has different lattice constants and a different crystal system. The present invention represents, therefore, a departure from known approaches.

A feature of this invention is a method which comprises the steps of forming a metallic layer on a monocrystalline semiconductor layer and growing subsequently a monocrystalline layer of semiconductor material on top of the metallic layer, where the last layer has the same crystal orientation as the original substrate.

The method is illustrated by an example where alternate layers of monocrystalline semiconductor material and metallic material are grown in an apparatus which is described in the following:

Figure 1:
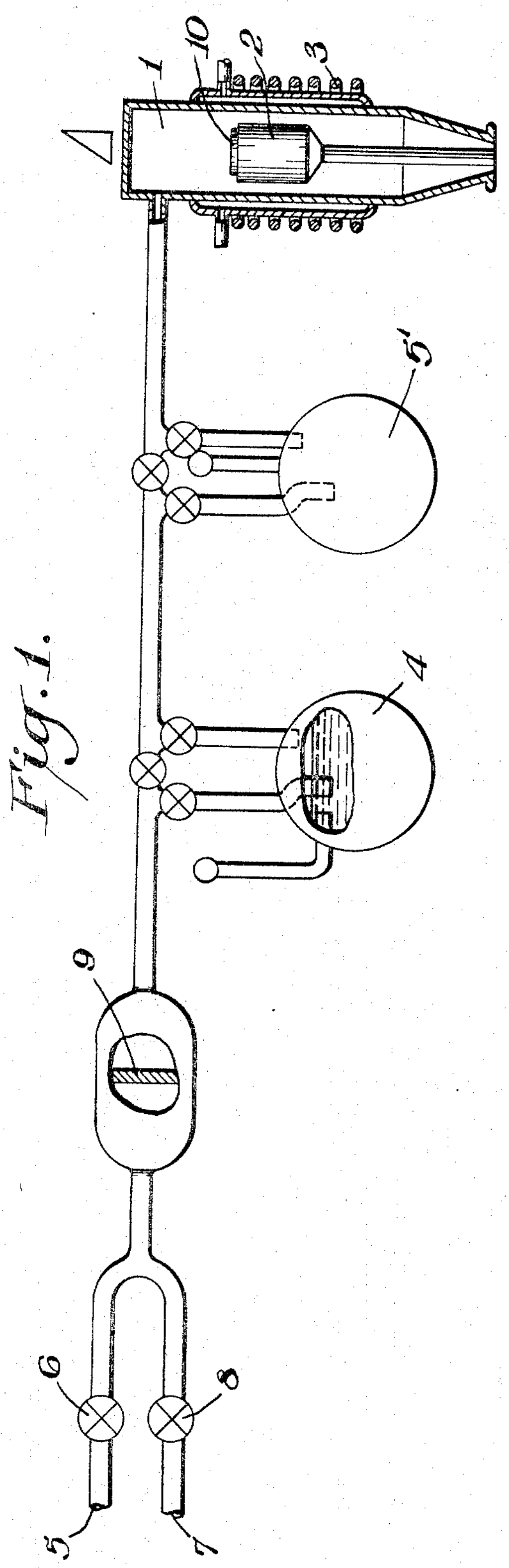
FIGURE 1 is a schematic representation of apparatus for making a semiconductor device according to this invention.

With reference to FIGURE 1, a device is grown according to the invention by carrying out different steps in a reaction chamber 1 containing a carbon pedestal 2 and being heated by an RF-coil 3. The first step consists in growing epitaxially on a wafer of monocrystalline semiconductor material, a first layer consisting of the same material as the wafer. The thermostatted reservoir 4 may serve for a supply of the material for the first layer. In epitaxial growth systems such a reservoir normally contains a compound of the material to be grown, and a high purity carrier gas introduced at 5 and regulated by the valve 6 is passed over the compound. The mixture of carrier gas and semiconductor material is reacted in chamber 1 which then leads to an epitaxial growth. The other inlet 7 with the valve 8 may be used for intermediate flushes or the introduction of other mixtures. A fritted disc 9 acts as a dust trap.

After the first layer has been grown the reservoir 4 is turned off and the carrier gas is passed through the reservoir 5', where it picks up material for the formation of the metallic layer. This material is carried to the chamber 1 and is reacted to a layer which is able to exhibit metallic conduction. In the next step the reservoir 5' is turned off and reservoir 4 is turned on again in order to now grow a layer of monocrystalline semiconductor material on top of the metallic layer. If wanted, the process can be repeated completely or partially after formation of the last layer.

In a typical experiment a silicon wafer was placed on the pedestal 2 and an epitaxial layer of silicon was grown on the wafer by the reduction of silicon tetrachloride in hydrogen at a temperature of 1250° C. Growth of epitaxial layer provides a surface in a more perfect state than the wafer surface for the acceptance of the metallic layer. The next step consisted of forming on the first layer a second layer, which is of metallic material, by the reduction of gaseous molybdenum pentachloride originating from reservoir 5' and being carried by hydrogen. Finally a monocrystalline layer of silicon was grown on the metallic layer by changing back to the reservoir 4 with silicon tetrachloride. The growth temperature for the metallic layer was 750° C. and the growth temperature for the silicon layer was 1250° C.

It should be understood that this experimental arrangement is only illustrating the principle of the method. It is for example possible to raise the temperature in the reaction chamber during the formation of the metallic layer up to 1250° C. The only difference is that the growth rate of the second (metallic) layer is then increased which in some cases may be desirable. At 750° C. the growth rate is about 5 A./min., with the source of solid molybdenum pentachloride 5 being kept at room temperature. Such a growth rate is very convenient for control of the thickness of the metallic layer. The thickness of this layer may reach a critical value beyond which the subsequent third layer of semiconductor material can not be grown monocrystalline any more. Typical values for the thickness of the metallic layer are from 50 to 500 A. However, layers of 1000 A. were grown from molybdenum pentachloride which still could be used for the formation of a subsequent monocrystalline layer of silicon. The other limiting condition on the thickness of the metal layer is that the layer must not exceed the mean free path of charge carriers traversing the layer.

The structure described in the foregoing paragraph can be achieved by other methods too. Similar results were obtained when chromium and titanium were utilized in place of molybdenum. As other suitable materials vanadium and tungsten may be depicted. Principally it is not necessary to restrict the method to refractory metals as listed above. Any metal can be used which forms a metallic layer of such properties that the latter does not alloy with the semiconductor material to such an extent that the metallic conduction is lost.

It was found that annealing of the metallic layer was beneficial for its electrical characteristics and the formation of the subsequent monocrystalline layer. Apparently the annealing affects the arrangement of the atoms in the metallic layer. It could be realized that, e.g., the metallic layer existed of oriented molybdenum disilicide when molybdenum was deposited from a molybdenum pentachloride source and when then the deposit was heated above 1050° C. for several minutes the degree of orientation was perfected with increasing time of annealing. Alternatively, instead of annealing separately, the metallic layer was grown at 1250° C. This resulted in a monocrystalline structure for the molybdenum disilicide.

The method is not restricted to the reduction of the source material for the metallic layer. The metallic layer may be also formed by evaporation of the metal itself. Furthermore other sources may be used than $MoCl_5$.

It is preferred to have all steps carried out in one system as indicated in FIGURE 1. The reason here is that no contamination from the outer atmosphere can reach the device during its growth.

It should be understood that the doping of the silicon can be adapted to any requirements. So, if for example an electron injection is anticipated, the silicon of the first and the third layer may have n-type conductivity. Changes in conductivity type and conductivity intensity may be changed according to special requirements.

Figure 2:
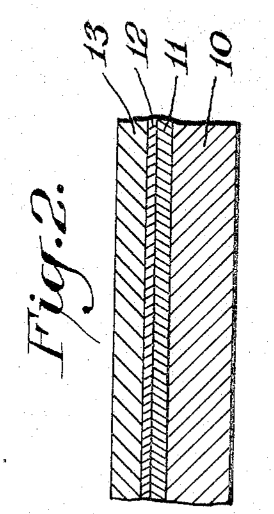
FIGURE 2 shows a structure manufactured according to this invention.

A structure completed according to the invention is shown in FIGURE 2. In this figure 10 represents the silicon wafer which carries an epitaxial layer 11 consisting of silicon of the same conductivity type as 10. The next layer 12 is a molybdenum disilicide layer which displays metallic conduction. This layer is about 200 A. thick. The thickness of metallic layer 12 is in the order of or less than the mean free path of the charge carrier traversing that layer. A final layer 13 of epitaxially grown silicon completes the device, which with the proper contacts to the layers 11, 12, and 13 may be used as a metal base transistor. In this structure both emitter and collector barriers are metal-semiconductor barrier regions. Gain has been observed in the structure of this configuration.

Obviously many modifications and variations of the present invention are possible in the light of the above teachings. It is, therefore, to be understood that within the scope of the appended claim the invention may be practiced otherwise than as specifically described.

What is claimed is:

A semiconductor device comprising a monocrystalline silicon wafer, an epitaxial layer of silicon having the same crystal orientation as said wafer superimposed in contact with said wafer, a layer of molybdenum disilicide superimposed in intimate barrier contact with said epitaxial layer, and a layer of monocrystalline silicon having the same crystal orientation as said wafer superimposed in intimate barrier contact with said molybdenum disilicide layer, said molybdenum disilicide layer having a thickness of 50 A. to 500 A. and less than the mean free path of charge carriers therein.

References Cited

UNITED STATES PATENTS

| | | | |
|---|---|---|---|
| 2,745,932 | 5/1956 | Glaser | 117—228 X |
| 2,998,334 | 8/1961 | Bakalar et al. | 148—185 X |
| 3,121,809 | 2/1964 | Atalla | 307—88.5 |
| 3,139,361 | 6/1964 | Rasmanis | 148—175 |
| 3,205,101 | 9/1965 | Milavsky et al. | 148—1.5 X |
| 3,250,966 | 5/1966 | Rose | 317—235 |

DAVID L. RECK, *Primary Examiner.*

C. N. LOVELL, *Assistant Examiner.*